United States Patent
Kondo

(10) Patent No.: US 11,275,121 B2
(45) Date of Patent: Mar. 15, 2022

(54) METHODS AND APPARATUS FOR COMPUTING PARASITIC RESISTANCE IN A BATTERY SYSTEM

(71) Applicant: SEMICONDUCTOR COMPONENTS INDUSTRIES, LLC, Phoenix, AZ (US)

(72) Inventor: Hideo Kondo, Oizumi-machi (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 35 days.

(21) Appl. No.: 16/948,805

(22) Filed: Oct. 1, 2020

(65) Prior Publication Data

US 2021/0382118 A1 Dec. 9, 2021

Related U.S. Application Data

(60) Provisional application No. 62/705,034, filed on Jun. 8, 2020.

(51) Int. Cl.
*G01R 31/388* (2019.01)
*G01R 31/389* (2019.01)
*H01M 10/44* (2006.01)
*H02J 7/00* (2006.01)

(52) U.S. Cl.
CPC ........ *G01R 31/388* (2019.01); *G01R 31/389* (2019.01); *H01M 10/44* (2013.01); *H02J 7/0048* (2020.01)

(58) Field of Classification Search
CPC ... H02J 7/0048; G01R 31/388; G01R 31/389; G01R 31/396; G01R 31/385; G01R 31/382; G01R 31/3828; G01R 31/3842; H01M 10/44
USPC .......................................... 324/427
See application file for complete search history.

(56) References Cited

U.S. PATENT DOCUMENTS

| | | | | |
|---|---|---|---|---|
| 9,411,398 B2 * | 8/2016 | Ji | ............... | G06F 1/324 |
| 2015/0046107 A1 | 2/2015 | Jo | | |
| 2015/0377976 A1 * | 12/2015 | Maluf | ............... | H02J 7/005 |
| | | | | 702/63 |
| 2018/0358661 A1 * | 12/2018 | Yebka | ............... | H02J 7/0029 |

* cited by examiner

*Primary Examiner* — Nathaniel R Pelton
(74) *Attorney, Agent, or Firm* — Dickinson Wright PLLC

(57) ABSTRACT

Various embodiments of the present technology may provide methods and apparatus for computing parasitic resistance in a battery system. The apparatus may provide various circuits to perform functions such as storing known battery characteristic data, measuring battery voltage, computing remaining capacity, determining whether the battery is charging in a constant current state, measuring the duration of the constant current state, and calculating the parasitic resistance based on the measured duration and the battery characteristic data.

20 Claims, 7 Drawing Sheets

METHODS AND APPARATUS FOR COMPUTING PARASITIC RESISTANCE IN A BATTERY SYSTEM

CROSS-REFERENCE TO RELATED APPLICATIONS

This application claims the benefit of U.S. Provisional Patent Application No. 62/705,034, filed on Jun. 8, 2020, the entire contents of which is incorporated herein by reference.

BACKGROUND OF THE TECHNOLOGY

"Battery capacity" is a measure (typically in ampere-hours) of the charge stored by the battery and is determined by the mass of active material contained in the battery. The battery capacity represents the maximum amount of energy that can be extracted from the battery under certain specified conditions. The remaining battery capacity can be represented as a percentage and referred to as a state of charge (SOC) or a relative state of charge (RSOC).

A fuel gauge is typically provided to measure various parameters of the battery and monitor the state of charge of the battery. Convention approaches to compute the state of charge include using the current of the battery (referred to as the "coulomb counting" method). The detected battery current is affected by a total resistance of the system, which includes the internal resistance of the battery (which changes as the battery ages) as well as parasitic resistance from the wires that connect the battery to the fuel gauge and/or to a host system. Therefore, it may be desired to know how much the parasitic resistance contributes to the total resistance versus the internal resistance of the battery. However, directly measuring the internal resistance as the battery ages is not practical. In addition, directly measuring the parasitic resistance in the wires can be time consuming and expensive.

SUMMARY OF THE INVENTION

Various embodiments of the present technology may provide methods and apparatus for computing parasitic resistance in a battery system. The apparatus may provide various circuits to perform functions such as storing known battery characteristic data, measuring battery voltage, computing remaining capacity, determining whether the battery is charging in a constant current state, measuring the duration of the constant current state, and calculating the parasitic resistance based on the measured duration and the battery characteristic data.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, timers, memory devices, switches, semiconductor devices, such as transistors and capacitors, and the like, which may carry out a variety of functions. In addition, the present technology may be integrated in any number of electronic systems, such as automotive, aviation, "smart devices," portables, e-cigarettes, aroma therapy puff systems, vaping devices, and consumer electronics, and the systems described are merely exemplary applications for the technology.

Figure 1:
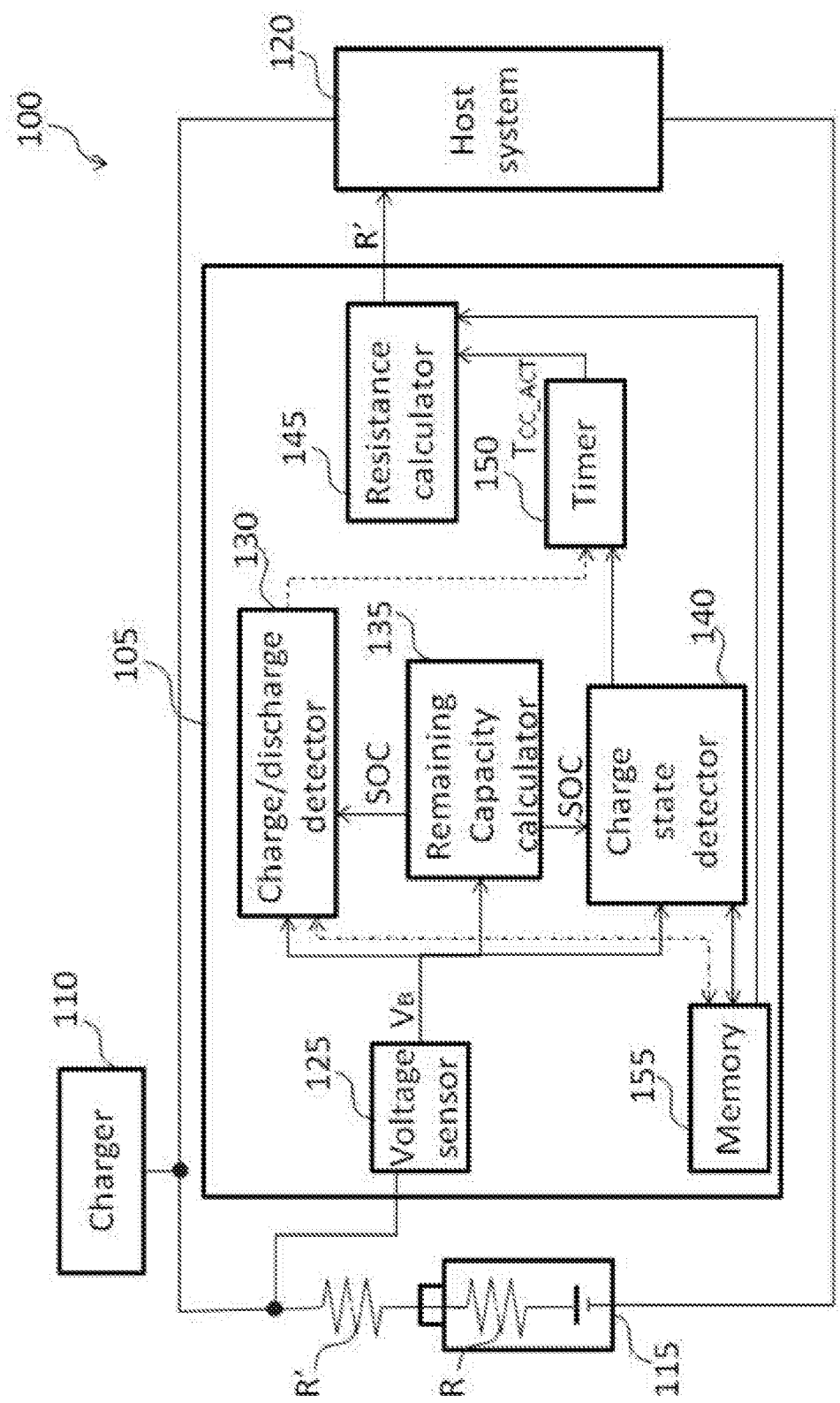
FIG. 1 is a block diagram of a battery system in accordance with an exemplary embodiment of the present technology.

Methods and apparatus for computing parasitic resistance in a battery system according to various aspects of the present technology may operate in conjunction with any suitable electronic system and/or device, such as "smart devices," wearables, battery-powered consumer electronics, portable devices, battery-powered vehicles, and the like. Referring to FIG. 1, a system 100 may be integrated in an electronic device (not shown), such as a smart watch or an electric vehicle, powered by a rechargeable battery 115, such as a lithium ion battery. In various embodiments, the system 100 may comprise the battery 115, a charger 110, a fuel gauge circuit 105, and a host system 120 (i.e., a load), wherein the battery 115 may operate in conjunction with the charger 110 and the fuel gauge circuit 105 to provide power to the host system 120.

The fuel gauge circuit 105 may be configured to manage various battery operations and monitor various battery conditions. For example, the fuel gauge circuit 105 may be configured to measure a voltage $V_B$ of the battery 115, compute a remaining capacity (also expressed as a percentage and referred to as the state of charge SOC) of the battery 115, compute a state of health (SOH) of the battery 115, estimate a lifespan of the battery 115, determine an energy capability of the battery, and the like. In addition, the fuel gauge circuit 105 may be configured to determine or compute characteristics that are external to the battery 115, such as a parasitic resistance R'. In an exemplary embodiment, the fuel gauge circuit 105 may comprise a voltage sensor 125, a memory 155, a charge/discharge detector 130, a remaining capacity calculator 135, a charge state detector 140, a timer 150, and a resistance calculator 145.

In an exemplary embodiment, the parasitic resistance R' represents the resistance in the wiring used to connect the battery 115 to the voltage sensor 125 of the fuel gauge circuit 105 and the host system 120. The parasitic resistance R' may also include the resistance introduced by a protection circuit (not shown), which is typically connected between the battery 115 and the fuel gauge circuit 105.

The voltage sensor 125 may be configured to measure or otherwise detect the voltage $V_B$ of the battery 115. The voltage sensor 125 may be connected to the battery 115 and may comprise any circuit and/or device suitable for measuring a voltage potential of the battery 115.

Figure 2:
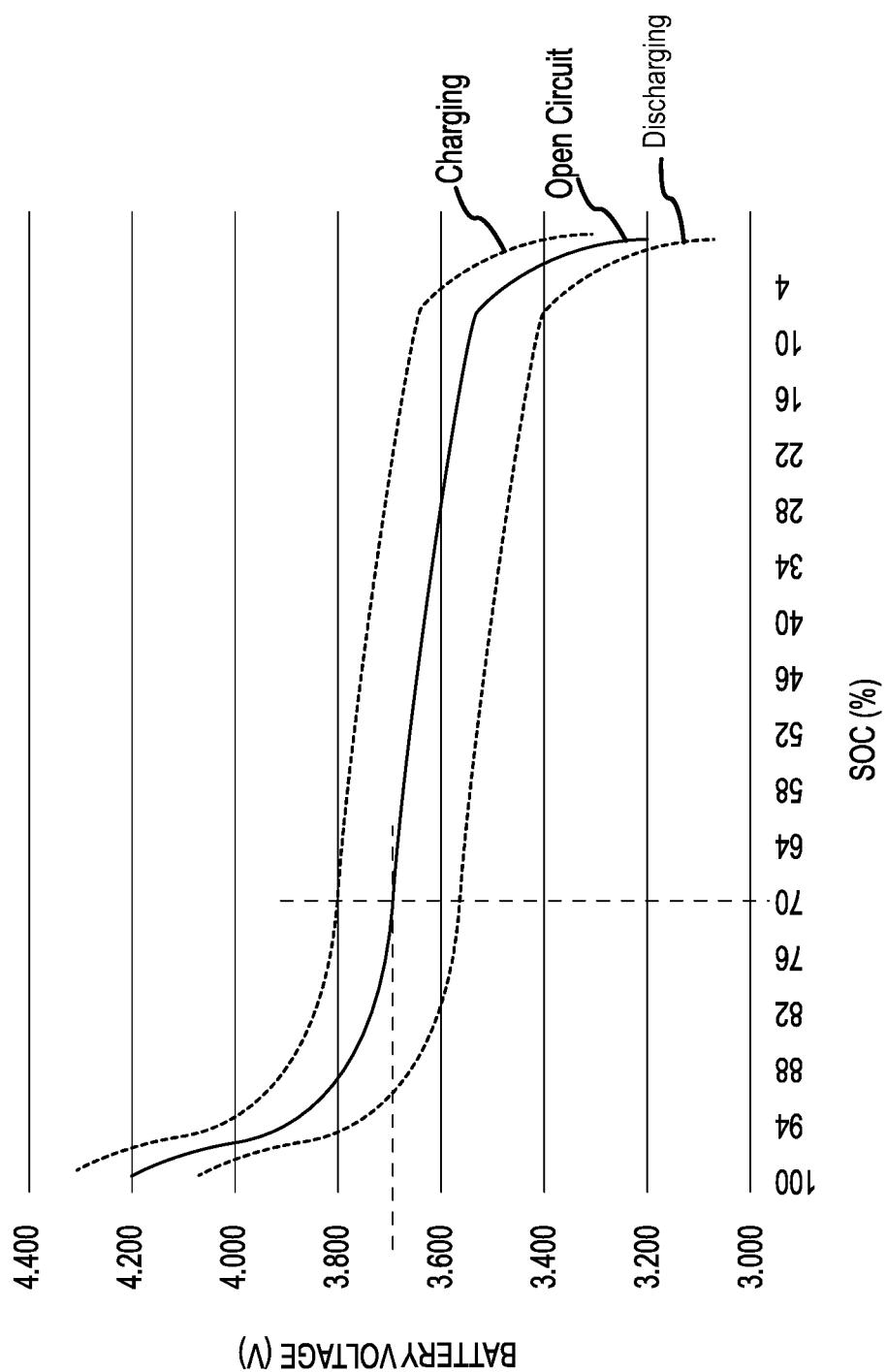
FIG. 2 is a graph illustrating battery voltage data and related remaining capacity data in accordance with an exemplary embodiment of the present technology.
Figure 3:
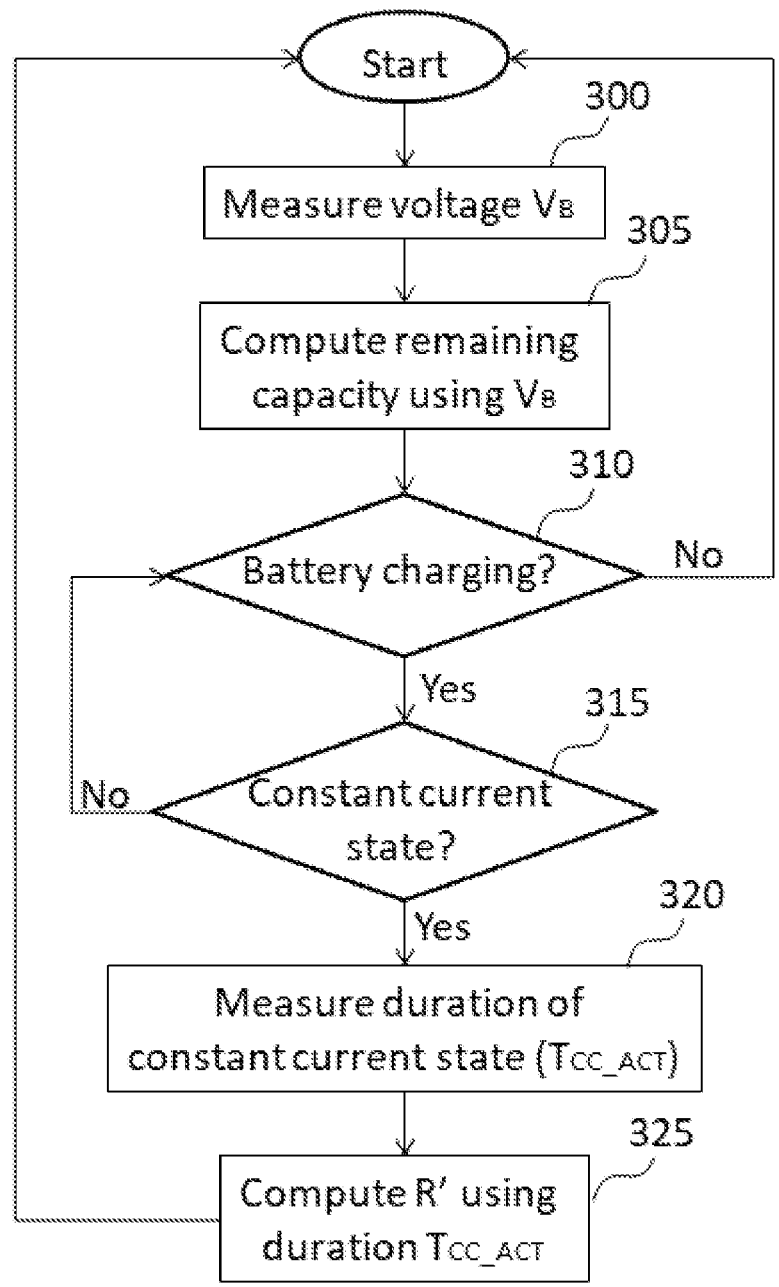
FIG. 3 is a flow chart for computing parasitic resistance in accordance with an exemplary embodiment of the present technology.
Figure 4:
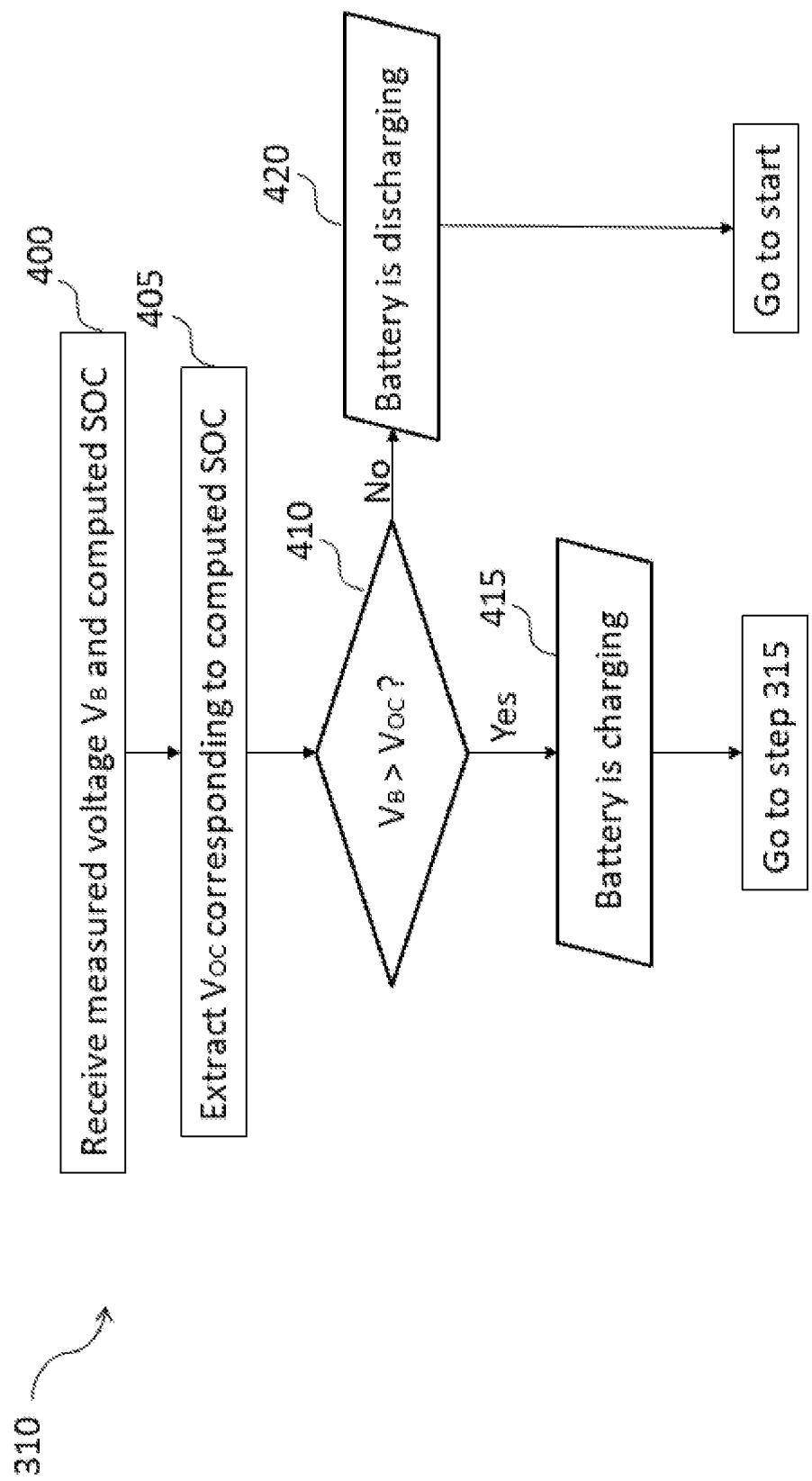
FIG. 4 is a flow chart for determining whether the battery is charging or discharging in accordance with an exemplary embodiment of the present technology.
Figure 5:
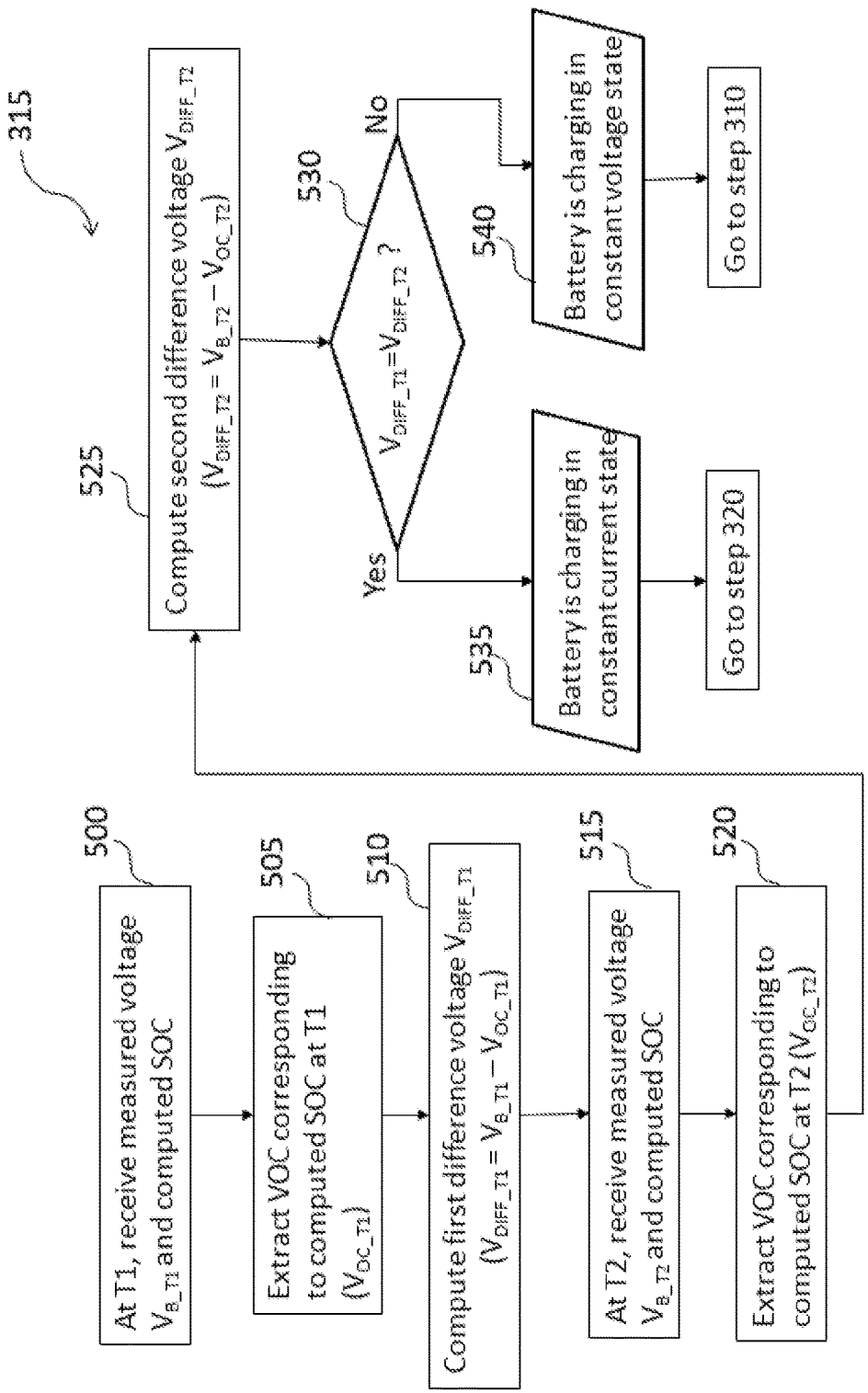
FIG. 5 is a flow chart for determining whether the battery is charging in a constant current state or charging in a constant voltage state in accordance with an exemplary embodiment of the present technology.

The memory 155 may store predetermined (known) battery characteristic data. For example, the memory 155 may store open circuit voltage characteristics comprising open circuit voltage data and corresponding remaining capacity data (i.e., SOC) of the battery 115 (e.g., as illustrated in FIG. 2). The open circuit voltage characteristics may be predetermined by testing the battery 115 under open circuit conditions (i.e., no load) and other conditions and may be stored in a look-up table or any other data storage suitable for storing relational data. In addition, the battery characteristic data may include a number of battery characteristic curves that provide voltage versus remaining capacity data, wherein each curve describes the voltage and remaining capacity relationship at a particular load/charge current parameter. The battery characteristic curves that are above the open circuit voltage curve represent charging curves with varying magnitudes (for simplicity, only one charging curve is shown). The battery characteristic curves that are below the open circuit voltage curve represent discharging curves with varying magnitudes (for simplicity, only one discharging curve is shown). The distance of the charging and discharging curves from the open circuit voltage curve are dependent on the internal resistance of the battery 115 and current (by Ohm's law).

The memory 155 may also store an initial internal resistance value R of the battery 115, which represents the internal resistance of the battery 115 when the battery 115 is new.

The memory 155 may also store an ideal duration of a constant current state $T_{CC\_ID}$ (i.e., duration of the constant current state in an ideal case). The memory 155 may store a number of ideal duration values, each corresponding to a particular remaining capacity value. In general, the greater the remaining capacity value, the lower the ideal duration value. For example, a battery with 20% remaining capacity will correspond to a longer constant current state compared to a battery with 60% remaining capacity, and a battery with 60% remaining capacity will correspond to a shorter constant current state compared to the battery at 20% remaining capacity.

The memory 130 may comprise any number of storage devices, such as registers, a flash memory device, EEPROM (electrically erasable programmable read-only memory), ROM (read only memory), and RAM (random access memory), and the like.

Figure 7A:
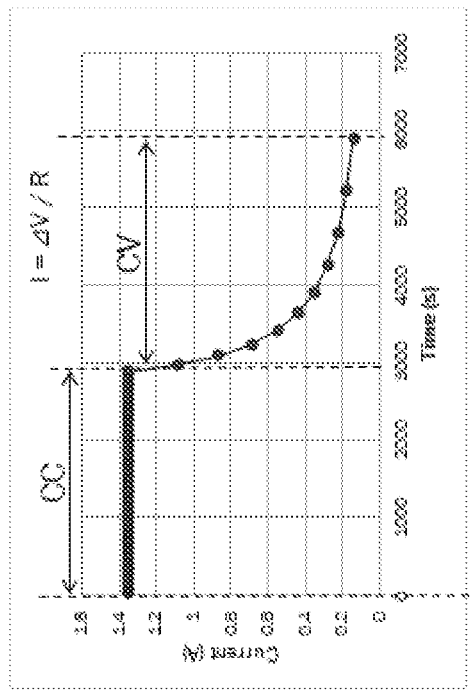
FIG. 7A illustrates a graph of battery current versus time under an ideal condition.
Figure 7B:
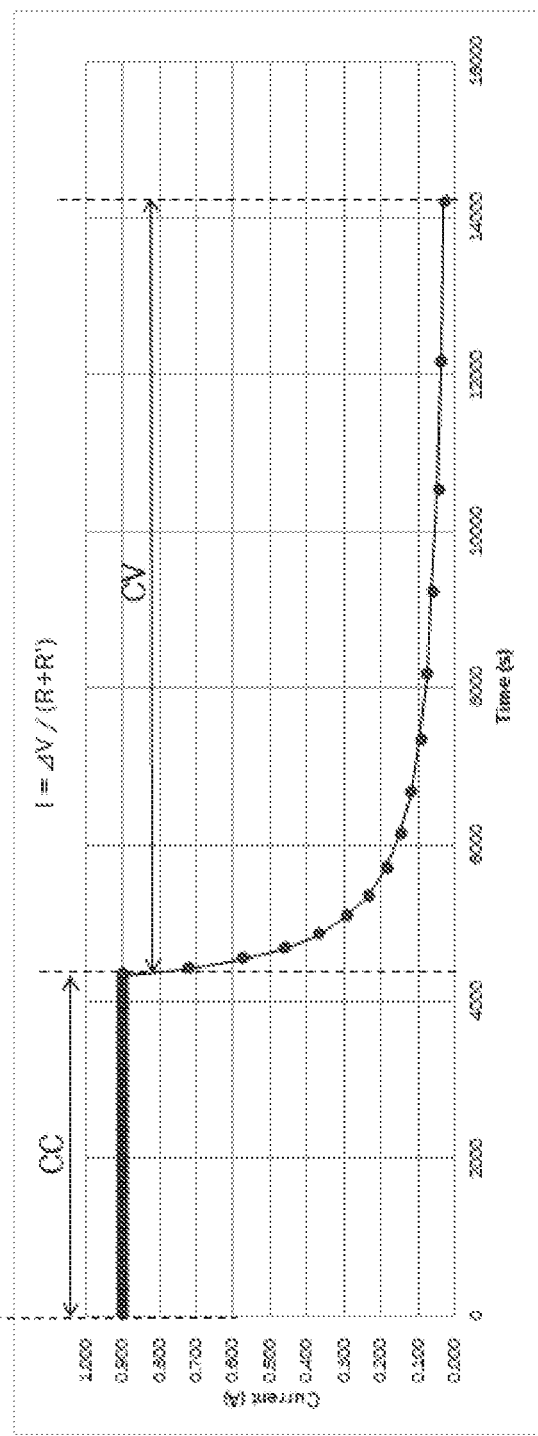
FIG. 7B illustrates a graph of battery current versus time under an actual condition.

Referring to FIGS. 7A and 7B, in the ideal case, the ideal duration $T_{CC\_ID}$ is based on an ideal battery current $I_{ideal}$, which assumes that there is no parasitic resistance R' (i.e., R'=0) in the system 100 and relies on the internal resistance R of the battery 115 as the only source of resistance. The ideal battery current is expressed as follows: $I_{ideal} = \Delta V/R$, where $\Delta V = V_B - V_{OC}$. However, in an actual case, an actual duration of the constant current state $T_{CC\_ACT}$ is based on an actual battery current $I_{act}$, which is influenced by the parasitic resistance R'. The actual battery current is expressed as follows: $I_{act} = \Delta V/(R+R')$. As a result, the duration of the constant current state in the ideal case $T_{CC\_ID}$ (FIG. 7A) is less than the duration of the constant current state in an actual case $T_{CC\_ACT}$ (FIG. 7B).

The remaining capacity calculator 135 may be configured to determine a remaining capacity (i.e., state of charge (SOC), given as a percentage) of the battery 115 based on the voltage of the battery 115 during an "open condition" ($V_{OC}$) and battery characteristic stored in the memory 155. The "open condition" means that the battery 115 is neither charging nor discharging. For example, the remaining capacity calculator 135 may receive the voltage $V_{OC}$ and extract the corresponding SOC value from the open circuit voltage characteristics stored in the memory 155, and determine an initial remaining capacity ($SOC_{t0}$) using the open circuit voltage $V_{OC}$. The remaining capacity calculator 135 may comprise any number of circuits, systems, and/or memory devices suitable for identifying an SOC value corresponding to a given voltage value. The remaining capacity calculator 135 may comprise, a processor (not shown), a number of logic gates (not shown), comparators (not shown), storage devices (e.g., registers) (not shown), and the like.

After determining the initial SOC using the open circuit voltage $V_{OC}$, the remaining capacity calculator 135 may compute a remaining capacity of the battery 115 using a detected current $I_{DD}$. For example, the remaining capacity calculator 135 may integrate the current $I_{DD}$ of the battery 115 over a period of time. This may be accomplished using a current sensor (not shown) and tracking the current $I_{DD}$ during charging and discharging operations. The remaining capacity calculator 135 may compute the remaining capacity ($SOC_t$) according to the following:

$$SOC_t = SOC_{t0} + \int_{t_0}^{t} \frac{\eta I}{C_n} dt$$

where $SOC_t$ is the estimated SOC at time t, $SOC_{t0}$ is the initial SOC when the estimation process starts, I is the current ($I_{DD}$), $\eta$ is the current efficiency, and $C_n$ is the nominal capacity of the battery 115. In general, utilizing the current $I_{DD}$ to determine the remaining capacity is referred to as "coulomb counting."

During the charging operation, the remaining capacity calculator 135 "sees" the actual current, which is influenced by the parasitic resistance R' and is less than the ideal current. Therefore, the length of time it takes for the battery 115 to reach a particular voltage and/or SOC value increases, thus increasing the time it takes for the battery 115 to switch from the constant current state to the constant voltage state increases. In sum, the duration of the actual constant current state $T_{CC\_ACT}$ is longer than the duration of the ideal constant current state $T_{CC\_ID}$.

The charge/discharge detector 130 may be configured to determine whether the battery 115 is charging or discharging. In an exemplary embodiment the charge/discharge detector 130 determines whether the battery 115 is charging or discharging based on the measured voltage $V_B$, the remaining capacity, and the battery characteristic data stored in the memory 155. For example, the charge/discharge detector 130 may determine that the battery 115 is charging if the measured voltage $V_B$ is greater than the open circuit voltage value at a particular remaining capacity value. For example, if the remaining capacity is 70%, this corresponds to open circuit voltage value of 3.7V. If the measured voltage $V_B$ is less than 3.7V, this means the battery 115 is discharging. If the measured voltage $V_B$ is greater than 3.7V, this means the battery 115 is charging.

In an exemplary embodiment, the charge/discharge detector 130 may be in communication with the remaining capacity calculator 135 and configured to receive the computed remaining capacity. In addition, the charge/discharge detector 130 may generate a first control signal and transmit the first control signal to the timer 150. The first control signal may control operation of the timer 150, such as starting, stopping, or resetting the timer 150.

Figure 6:
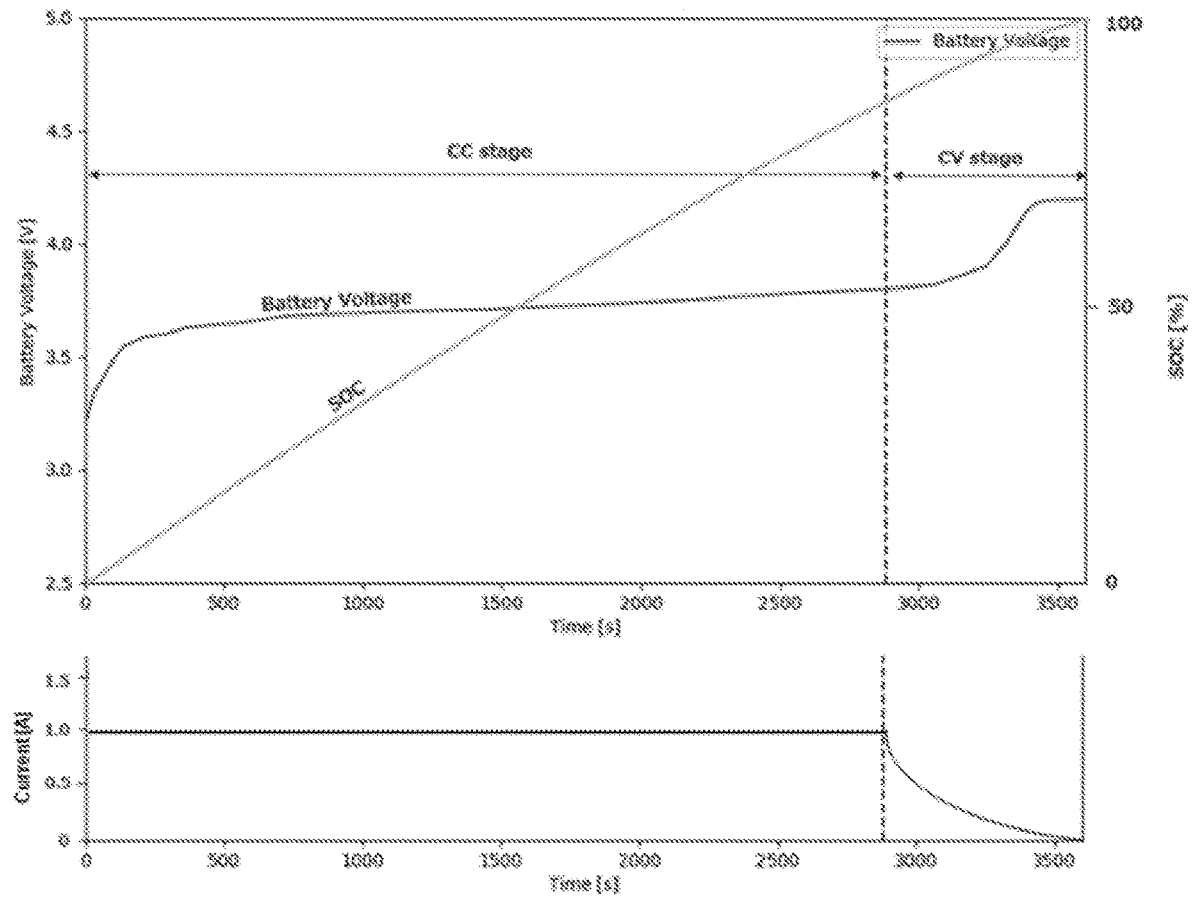
FIG. 6 illustrates graphs of battery voltage and current during a constant current state and a constant voltage state.

In an exemplary embodiment, and referring to FIGS. 1 and 6, the charge state detector 140 may be configured to determine whether the battery 115 is charging in a constant current (CC) state or charging in a constant voltage (CV) state. The constant current state is defined as a period of time when the battery 115 is charging at a constant current value. The constant voltage state is defined as a period of time when the battery 115 is charging at a constant voltage value.

In an exemplary embodiment, the charge state detector 140 may use the measured voltage $V_B$, the computed remaining capacity, and the battery characteristic data to determine whether the battery 115 is in the CC state. For example, the charge state detector 140 may be configured to compute a first difference voltage $V_{DIFF\_T1}$ at an initial time T1, wherein the first difference voltage $V_{DIFF\_T1}$ is the difference between a measured voltage $V_B$ at T1 ($V_{B\_T1}$) and the open circuit voltage $V_{OC}$ at a particular remaining capacity value ($V_{DIFF\_T1}=V_{B\_T1}-V_{OC\_T1}$). For instance, if, at T1, the remaining capacity is 70%, then the corresponding open circuit voltage is 3.7V. If the measured voltage $V_B$ is 3.8V, then the difference voltage $V_{DIFF\_T1}$ is 0.1V. The charge state detector 140 may store the first difference voltage $V_{DIFF\_T1}$ in the memory 155 or other suitable storage device.

The charge state detector 140 may be further configured to compute a second difference voltage $V_{DIFF\_T2}$ at a later time T2, wherein the second difference voltage $V_{DIFF\_T2}$ is the difference between a measured voltage $V_B$ at T2 ($V_{B\_T2}$) and the open circuit voltage $V_{OC}$ at a particular remaining capacity value ($V_{DIFF\_T2}=V_{B\_T2}-V_{OC\_T2}$). Since the battery 115 is charging, the remaining capacity at T2 will be greater than the remaining capacity at T1. The charge state detector 140 may store the second difference voltage $V_{DIFF\_T2}$ in the memory 155 or other suitable storage device.

The charge state detector 140 may be further configured to compare the first difference voltage $V_{DIFF\_T1}$ and the second difference voltage $V_{DIFF\_T2}$. In an exemplary embodiment, the charge state detector 140 may determine that the battery 115 is charging in the constant current state if the second difference voltage $V_{DIFF\_T2}$ is equal to the first difference voltage $V_{DIFF\_T1}$. The charge state detector 140 may determine that the battery 115 is charging in the constant voltage state if the second difference voltage $V_{DIFF\_T2}$ is less than the first difference voltage $V_{DIFF\_T1}$.

In an exemplary embodiment, as long as the battery 115 is charging, the charge state detector 140 may continue to compute a number of difference voltages over time and monitor the comparison from one difference voltage to a consecutive difference voltage until the most recent difference voltage is less than the previous difference voltage, which indicates a change from the constant current state to the constant voltage state. The charge state detector 140 may generate a second control signal in response to the change in state (from the constant current state to the constant voltage state) and transmit the second control signal to the timer 150. The second control signal may enable (start), disable (stop), or reset the timer 150.

The charge state detector 140 may be connected to (or otherwise in communication with) the voltage sensor 125 and receive measured voltage values $V_B$. The charge state detector 140 may be connected to (or otherwise in communication with) the remaining capacity calculator 135 and receive calculated remaining capacity values (SOC). The charge state detector 140 may also be connected to (or otherwise in communication with) the memory 155 to receive or otherwise retrieve open circuit voltage values based on the remaining capacity values from the remaining capacity calculator 135. The charge state detector 140 may comprise any circuit and/or system suitable for performing arithmetic functions, such as addition and subtraction, performing comparisons, performing logic functions, and storing data. For example, the charge state detector 140 may comprise a number of logic gates (not shown), comparators (not shown), storage devices (e.g., registers) (not shown), and the like.

The timer 150 may be configured to measure an elapsed time by incrementing in value according to a clock signal (not shown). In an exemplary embodiment, the timer 150 may measure the actual duration of the constant current state $T_{CC\_ACT}$. Each increment in value may be equivalent to 1 second (s), however the equivalent time value in seconds may be based on the frequency of the clock signal. The timer 150 may comprise any device and/or system suitable for measuring or otherwise counting time. In addition, the timer 150 may be started, stopped, and/or reset at any time.

In an exemplary embodiment, the timer 150 may receive the second control signal from the charge state detector 140 and operate according to the second control signal. For example, the second control signal may be used to start, stop, or reset the timer 150. In one embodiment, the charge state detector 140 may start the timer 150 when the charge state detector 140 detects that the battery 115 is charging in the constant current state and may stop the timer 150 when the charge state detector 140 detects the battery 115 is charging in the constant voltage state. Alternatively, the charge/discharge detector 130 may start the timer 150 when it detects that the battery 115 is charging and the charge state detector 140 may stop and reset the timer 150 when it detects a switch from the constant current state to the constant voltage state. In either case, the timer 150 measures the actual duration of the constant current state $T_{CC\_ACT}$. The timer 150 may transmit the measured actual duration $T_{CC\_ACT}$ to the resistance calculator 145.

The resistance calculator 145 may be configured to compute the parasitic resistance R' and transmit the computed parasitic resistance R' to the host system 120 and/or to the remaining capacity calculator 135. In an exemplary embodiment, the parasitic resistance R' is defined according to the following: $R'=R(T_{CC\_ACT}-T_{CC\_ID})/T_{CC\_ID}$, where R is internal resistance of the battery 115, $T_{CC\_ACT}$ is the measured actual duration of the constant current state at a particular remaining capacity, and $T_{CC\_ID}$ is the ideal duration of the constant current state at the same remaining capacity for that of $T_{CC\_ACT}$. The resistance calculator 145 may comprise any circuit and/or system suitable for performing arithmetic functions, such as addition, subtraction, multiplication, and division, and storing data. For example, the charge state detector 140 may comprise a number of logic gates (not shown), comparators (not shown), storage devices (e.g., registers) (not shown), and the like.

In operation, and referring to FIGS. 1-5, the voltage sensor 125 may measure the battery voltage $V_B$ (300) and transmit the measured voltage $V_B$ to the remaining capacity calculator 135, the charge/discharge detector 130, and the charge state detector 140.

The remaining capacity calculator 135 may compute the remaining capacity ($SOC_t$) using the measured battery voltage $V_B$, current, and the battery characteristic data as described above (305). The remaining capacity calculator 135 may transmit the computed remaining capacity to the charge/discharge detector 130 and the charge state detector 140.

The charge/discharge detector 130 may determine if the battery 115 is charging (310). For example, the charge/discharge detector 130 may receive the measured voltage $V_B$ and the computed remaining capacity (400). The charge/discharge detector 130 may then extract (from the memory 155) the open circuit voltage $V_{OC}$ that corresponds to the computed SOC (405) and compare the measured voltage $V_B$ with the open circuit voltage $V_{OC}$ (410). If the measured voltage is greater than the open circuit voltage $V_{OC}$, this means the battery 115 is charging (415). If the measured voltage $V_B$ is not greater than the open circuit voltage $V_{OC}$, this means the battery 115 is discharging (420). If the battery 115 is not charging (i.e., discharging), then the fuel gauge circuit 105 continues to measure the battery voltage $V_B$, transmit the measured voltage $V_B$ to the remaining capacity calculator 135, the charge/discharge detector 130, and the charge state detector 140, and compute the remaining capacity until the charge/discharge detector 130 determines that the battery 115 is charging. If the charge/discharge detector 130 determines that the battery 115 is charging, then the charge/discharge detector 130 may transmit the first control signal to the timer 150 to start the counting operation of the timer 150.

The charge state detector 140 may determine if the battery 115 is charging in the constant current state (315). For example, at time T1, the charge state detector 140 may receive the measured voltage $V_B$ and the computed remaining capacity (500). The charge state detector 140 may then extract (from the memory 155) the open circuit voltage $V_{OC}$ that corresponds to the computed SOC at T1 (referred to as $V_{OC\_T1}$) (505). The charge state detector 140 may then compute the first difference voltage $V_{DIFF\_T1}$ according to the equation described above. At time T2, the charge state detector 140 may receive a new measured battery voltage $V_B$ and a new computed remaining capacity (515) and extract (from the memory 155) a new open circuit voltage that corresponds to the computed SOC at T2 (referred to as $V_{OC\_T2}$) (520). The charge state detector 140 may then compute a second difference voltage $V_{DIFF\_T2}$ according to the equation described above (525) and compare the first difference voltage $V_{DIFF\_T1}$ with the second difference voltage $V_{DIFF\_T2}$ (530). If the first difference voltage $V_{DIFF\_T1}$ is equal to the second difference voltage $V_{DIFF\_T2}$, the charge state detector 140 determines that the battery is charging in the constant current state (535). If the first difference voltage $V_{DIFF\_T1}$ is not equal to the second difference voltage $V_{DIFF\_T2}$, the charge state detector 140 determines that the battery is charging in the constant voltage state (540).

If the battery 115 is charging in the constant voltage state, then the fuel gauge circuit 105 may continue to monitor whether the battery 115 is charging or discharging. If the battery 115 is charging, the charge state detector 140 may continue to monitor whether the battery is in the constant current state or in the constant voltage state. If the battery 115 is charging in the constant current state, the timer 150 will continue to measure the elapsed time until the charge state detector 140 detects a change from the constant current state to the constant voltage state. As described above, a change from the constant current state to the constant voltage state may be detected by monitoring the comparison between two consecutive computed difference voltages (e.g., $V_{DIFF\_T1}$ and $V_{DIFF\_T2}$). When the charge state detector 140 detects a change from the constant current state to the constant voltage state, the charge state detector 140 may generate the second control signal to stop the timer 150. Thus, the elapsed time measured by the timer 150 represents the actual duration of the constant current state $T_{CC\_ACT}$. The timer 150 may transmit the actual duration $T_{CC\_ACT}$ to the resistance calculator 145.

The resistance calculator 145 may compute the parasitic resistance R' using the actual duration $T_{CC\_ACT}$, as described above. The resistance calculator 145 may also receive or otherwise retrieve data from the memory 155, such as the ideal duration of the constant current state $T_{CC\_ID}$ and the internal resistance R' of the battery 115. The ideal duration value used to compute the parasitic resistance R' will correspond to the same SOC as that of the SOC at the start of the constant current state. In other words, if the SOC is 70% when the timer 150 is started, then the ideal duration value that corresponds to a 70% SOC will be used to compute the parasitic resistance R'.

In various embodiments, the resistance calculator 145 may transmit the computed parasitic resistance R' to the remaining capacity circuit 135, the host system 120, and/or other computation devices. The remaining capacity circuit 135 may use the parasitic resistance R' to compute later values of the remaining capacity, and the host system 120 and/or fuel gauge circuit 105 may use the parasitic resistance R' to compute other battery characteristics, such as lifespan of the battery, state of health of the battery, and the like.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus capable of connecting to a battery with a wire that has a parasitic resistance, comprising:
   a memory configured to store known battery characteristic data;
   a voltage sensor connected to the battery and configured to measure a voltage of the battery;
   a remaining capacity calculation circuit in communication with the voltage sensor and configured to compute a remaining capacity of the battery based on the measured voltage and battery characteristic data;
   a charge state detection circuit in communication with the voltage sensor and memory, and configured to determine whether the battery is charging in a constant current state based on the measured voltage and the remaining capacity;
   a timer in communication with the charge state detection circuit and configured to measure an actual duration of the constant current state; and
   a calculation circuit configured to compute the parasitic resistance based on the measured actual duration and the known battery characteristic data.

2. The apparatus according to claim 1, wherein the constant current state is defined as charging the battery with a constant current.

3. The apparatus according to claim 1, wherein the calculation circuit computes the parasitic resistance based on an ideal duration of the constant current state and an internal resistance value of the battery, wherein the ideal duration is less than the actual duration.

4. The apparatus according to claim 1, wherein the known battery characteristic data comprises:
   open circuit voltage data and corresponding remaining capacity data; and
   an ideal duration of the constant current state.

5. The apparatus according to claim 4, further comprising a charge detection circuit in communication with the voltage detector and the memory and configured to determine whether the battery is charging, wherein determining whether the battery is charging comprises determining that the measured voltage is greater than an open circuit voltage value from the open circuit voltage data.

6. The apparatus according to claim 5, wherein determining whether the battery is in the constant current state comprises:
   computing a first difference voltage value defined as the difference between a first measured voltage and a first open circuit voltage value from the battery characteristic data, wherein the first open circuit voltage value corresponds to a first measured remaining capacity;
   computing a second difference voltage value defined as the difference between a second measured voltage and a second open circuit voltage value from the battery characteristic data, wherein the second open circuit voltage value corresponds to a second measured remaining capacity; and
   comparing the first difference voltage value with the second difference voltage value;
   wherein the battery is in constant current state if the second difference voltage value is equal to the second difference voltage value.

7. The apparatus according to claim 1, wherein the calculation circuit is configured to compute a plurality of parasitic resistance values and compute an average the plurality of parasitic resistance values.

8. A method for determining a parasitic resistance of a wire connecting a fuel gauge circuit to a battery, comprising:
   storing known battery characteristic data;
   measuring a voltage of the battery;
   computing a remaining capacity of the battery according to the measured voltage and the battery characteristic data;
   determining whether the battery is charging in a constant current state based on the measured voltage and the remaining capacity;
   measuring an actual duration of the constant current state; and
   computing the parasitic resistance based on the measured actual duration of the constant current state and the battery characteristic data.

9. The method according to claim 8, wherein the constant current state is defined as charging the battery with a constant current.

10. The method according to claim 8, wherein the known battery characteristic data comprises:
    open circuit voltage data and corresponding remaining capacity data;
    an ideal duration of the constant current state; and
    an internal resistance value of the battery.

11. The method according to claim 10, wherein the calculation circuit computes the parasitic resistance based on an ideal constant current duration and an internal resistance value of the battery, wherein the ideal constant current duration is less than the actual duration.

12. The method according to claim 10, wherein determining whether the battery is charging comprises determining that the measured voltage is greater than an open circuit voltage value from the open circuit voltage data.

13. The method according to claim 12, wherein determining whether the battery is in the constant current state comprises:

computing a first difference voltage value defined as the difference between a first measured voltage and a first open circuit voltage value from the battery characteristic data, wherein the first open circuit voltage value corresponds to a first measured remaining capacity;

computing a second difference voltage value defined as the difference between a second measured voltage and a second open circuit voltage value from the battery characteristic data, wherein the second open circuit voltage value corresponds to a second measured remaining capacity; and comparing the first difference voltage to the second difference voltage;

wherein the battery is in the constant current state if the second difference voltage value is equal to the second difference voltage value.

14. The method according the claim 8, further comprising computing a plurality of parasitic resistance values and computing an average of the plurality of parasitic resistance values.

15. A system, comprising:
a battery; and
a fuel gauge circuit connected to the battery with a wire that has a parasitic resistance, wherein the fuel gauge circuit is configured to:
store known battery characteristic data comprising:
open circuit voltage data and corresponding remaining capacity data;
an ideal duration of a constant current state; and
an internal resistance value of the battery;
measure a voltage of the battery;
compute a remaining capacity of the battery according to the measured voltage and the battery characteristic data;
determine whether the battery is charging in the constant current state based on the measured voltage and the remaining capacity;
measure an actual duration of the constant current state; and
compute the parasitic resistance based on the actual duration, the internal resistance value, and the ideal duration.

16. The system according to claim 15, determining whether the battery is charging comprises determining that the measured voltage is greater than an open circuit voltage value from the open circuit voltage data.

17. The system according to claim 15, wherein determining whether the battery is charging in the constant current state comprises:
computing a first difference voltage value defined as the difference between a first measured voltage and a first open circuit voltage value from the battery characteristic data, wherein the first open circuit voltage value corresponds to a first measured remaining capacity;
computing a second difference voltage value defined as the difference between a second measured voltage and a second open circuit voltage value from the battery characteristic data, wherein the second open circuit voltage value corresponds to a second measured remaining capacity; and
comparing the first difference voltage value with the second difference voltage value.

18. The system according to claim 17, wherein the battery is in the constant current state if the second difference voltage value is equal to the second difference voltage value.

19. The system according to claim 15, wherein the ideal duration is less than the actual duration.

20. The system according to claim 15, wherein the fuel gauge circuit is further configured to compute a plurality of parasitic resistance values and compute an average of the plurality of parasitic resistance values.

* * * * *